US012689445B2

(12) United States Patent
Kita et al.

(10) Patent No.: US 12,689,445 B2
(45) Date of Patent: Jul. 21, 2026

(54) ANALOG-DIGITAL CONVERSION METHOD AND ANALOG-DIGITAL CONVERTER

(71) Applicant: NTT, Inc., Tokyo (JP)

(72) Inventors: Shota Kita, Tokyo (JP); Masaya Notomi, Tokyo (JP); Kengo Nozaki, Tokyo (JP); Akihiko Shinya, Tokyo (JP)

(73) Assignee: NTT, INC., Tokyo (JP)

( * ) Notice: Subject to any disclaimer, the term of this patent is extended or adjusted under 35 U.S.C. 154(b) by 276 days.

(21) Appl. No.: 18/556,837

(22) PCT Filed: Apr. 28, 2021

(86) PCT No.: PCT/JP2021/016967
§ 371 (c)(1),
(2) Date: Oct. 23, 2023

(87) PCT Pub. No.: WO2022/230105
PCT Pub. Date: Nov. 3, 2022

(65) Prior Publication Data
US 2025/0141563 A1      May 1, 2025

(51) Int. Cl.
*H04B 10/63* (2013.01)
*H03M 1/12* (2006.01)

(52) U.S. Cl.
CPC .............. *H04B 10/63* (2013.01); *H03M 1/12* (2013.01)

(58) Field of Classification Search
CPC ...... H04B 10/63; H04B 10/541; H04B 10/54; H04B 10/60; H04B 10/61; H04B 10/613;
(Continued)

(56) References Cited

U.S. PATENT DOCUMENTS 6,917,031 B1 * 7/2005 Sun ...................... H04B 10/614
250/214 R
2010/0202785 A1 8/2010 Kawanishi et al.
(Continued)

FOREIGN PATENT DOCUMENTS

JP        2009094988 A    4/2009
JP        2015154155 A    8/2015
WO      2019167620 A1   9/2019

OTHER PUBLICATIONS

Liu et al., "HolyLight: A Nanophotonic Accelerator for Deep Learning in Data Centers," IEEE, Published in 2019 Design, Automation & Test in Europe Conference & Exhibition, Florence, Italy, Mar. 2019, pp. 1483-1488. As discussed in the specification.
(Continued)

*Primary Examiner* — Hibret A Woldekidan
(74) *Attorney, Agent, or Firm* — Slater Matsil, LLP

(57) ABSTRACT

An analog-digital conversion method according to the present invention is a method for converting an optical analog signal into an electrical digital signal, the method including: performing at least one of affine transformation with first reference light and homodyne detection with a detection axis of second reference light on the optical analog signal; converting the optical analog signal subject to transformation or detection into an electrical analog signal by photoelectric conversion; and converting the electrical analog signal into an electrical digital signal by thresholding.

14 Claims, 27 Drawing Sheets

(58) Field of Classification Search
CPC .. H04B 10/612; H04B 10/614; H04B 10/616;
H03M 1/12; G02F 7/00
See application file for complete search history.

(56) References Cited

U.S. PATENT DOCUMENTS

| 2013/0328706 | A1 |  | 12/2013 | Marom |  |
| 2019/0028206 | A1 | * | 1/2019 | Su | H04L 9/0852 |
| 2020/0408989 | A1 |  | 12/2020 | Kita et al. |  |

OTHER PUBLICATIONS

Shen et al., "Deep learning with coherent nanophotonic circuits," Nature Photonics, vol. 11, Jul. 2017, www.nature.com/naturephotonics, pp. 441-447. As discussed in the specification.

* cited by examiner

Fig. 7B

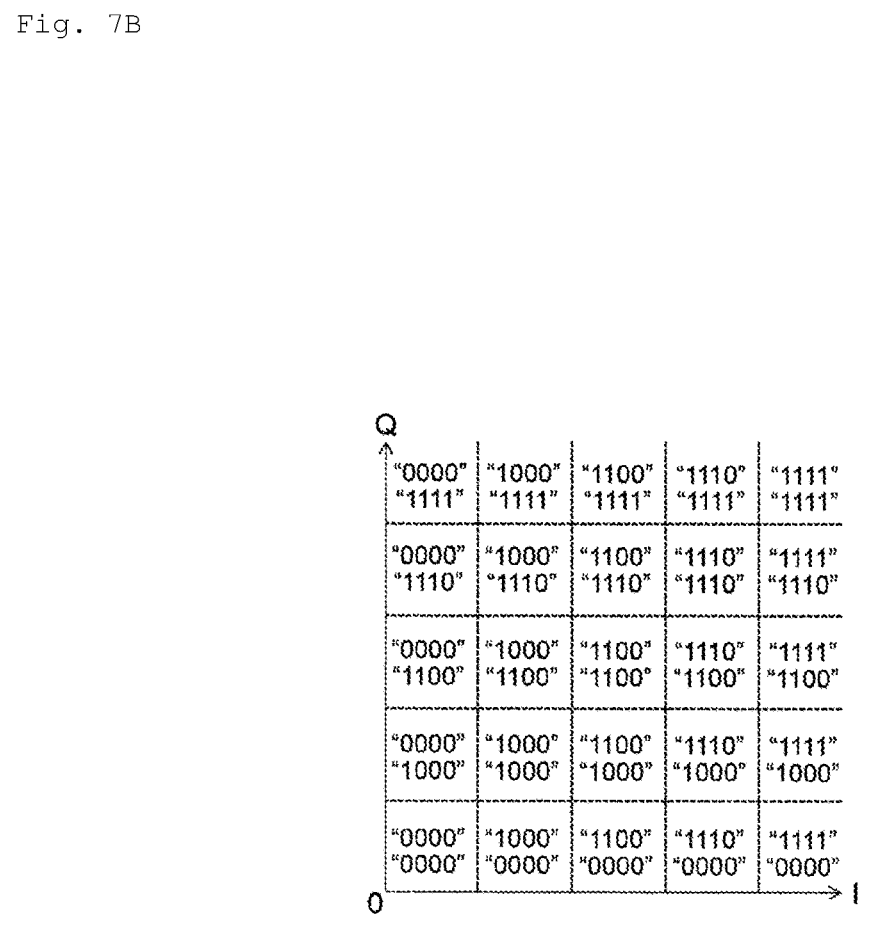

| | | | | |
|---|---|---|---|---|
| "0000" "1111" | "1000" "1111" | "1100" "1111" | "1110" "1111" | "1111" "1111" |
| "0000" "1110" | "1000" "1110" | "1100" "1110" | "1110" "1110" | "1111" "1110" |
| "0000" "1100" | "1000" "1100" | "1100" "1100" | "1110" "1100" | "1111" "1100" |
| "0000" "1000" | "1000" "1000" | "1100" "1000" | "1110" "1000" | "1111" "1000" |
| "0000" "0000" | "1000" "0000" | "1100" "0000" | "1110" "0000" | "1111" "0000" |

ANALOG-DIGITAL CONVERSION METHOD AND ANALOG-DIGITAL CONVERTER

CROSS-REFERENCE TO RELATED APPLICATIONS

This application is a national phase entry of PCT Application No. PCT/JP2021/016967, filed on Apr. 28, 2021, which application is hereby incorporated herein by reference.

TECHNICAL FIELD

The present invention relates to an opto-electronic analog-digital conversion method and an analog-digital converter, each of which is capable of reducing power consumption.

BACKGROUND

In recent years, as one of new application technologies on the premise of large-scale integration of on-chip optical devices, an optical analog computing unit represented by an optical neural network accelerator has been researched and developed (NPL 1).

In the optical analog computing unit, vector computation by optical interference can ideally be performed with zero-energy consumption (energy saving), and computation delay can be reduced by a specific application (low delay), attracting many stakeholders' attention.

In the optical analogue computing unit, the input/output optical signals are analog signals. Therefore, the following converters need to be operated: an electro-optic analog-digital converter (see PTL 1) which is a mechanism for converting an electrical digital signal into an optical analog signal, and an opto-electronic analog-digital converter which is a mechanism for converting an optical analog signal into an electrical digital signal.

A current general O-E ADC has a configuration in which a photodetector and an electrical ADC having a predetermined number of bits (about 8-12 bits) are combined. A parallel ADC is required to enable operation at a high speed of at least several GHz in this configuration.

CITATION LIST

Patent Literature

PTL 1—WO 2019/167620

Non Patent Literature

NPL 1—Y. Shen et al., "Deep learning with coherent nanophotonic circuits," Nature Photon 11, 441-446 (2017)

NPL 2—W. Liu et al., "HolyLight: A Nanophotonic Accelerator for Deep Learning in Data Centers," 2019 Design, Automation & Test in Europe Conference & Exhibition (DATE), Florence, Italy, 1483-1488 (2019)

SUMMARY

Technical Problem

However, a parallel ADC requires 2(N−1) (N is bit resolution) comparators, whereby the power consumption is large, and it is estimated that about 80 to 90% of the power of the entire optical neural network accelerator is consumed (NPL 2).

As described above, in a case where a parallel ADC is used in the O-E ADC, problems arise out of large power consumption.

It is desirable to perform all the processing in the ADC with optical processing as much as possible, but it is difficult to perform all the thresholding process with optical processing. Therefore, it is necessary to perform all the processing other than thresholding in the ADC with optical processing to the extent possible.

Solution to Problem

For solving the problems mentioned above, an analog-digital conversion method according to embodiments of the present invention is a method for converting an optical analog signal into an electrical digital signal, the method including: performing at least one of affine transformation with first reference light and homodyne detection with a detection axis of second reference light on the optical analog signal; converting the optical analog signal subject to transformation or detection into an electrical analog signal by opto-electronic conversion; and converting the electrical analog signal into an electrical digital signal by thresholding.

An analog-digital converter according to embodiments of the present invention is an analog-digital converter for converting an optical analog signal into an electrical digital signal, including: a second reference light generation unit configured to generate second reference light; a detection unit configured to acquire an electrical analog signal by homodyne detection with the second reference light; and a conversion unit configured to convert the electrical analog signal into an electrical digital signal by thresholding.

Furthermore, an analog-digital converter according to embodiments of the present invention is an analog-digital converter for converting an optical analog signal into an electrical digital signal, including: a first reference light generation unit configured to generate first reference light; a computing unit configured to perform affine transformation on the optical analog signal with the first reference light; and a conversion unit configured to convert the optical analog signal into an electrical digital signal by thresholding.

Advantageous Effects of Invention

According to embodiments of the present invention, it is possible to provide an analog-digital conversion method and an analog-digital converter, each of which is capable of reducing power consumption.

BRIEF DESCRIPTION OF THE DRAWINGS

FIG. 7B is a diagram illustrating one example of the analog-digital conversion method according to the first and second embodiments of the present invention.

DETAILED DESCRIPTION OF ILLUSTRATIVE EMBODIMENTS

First Embodiment

Figure 1:
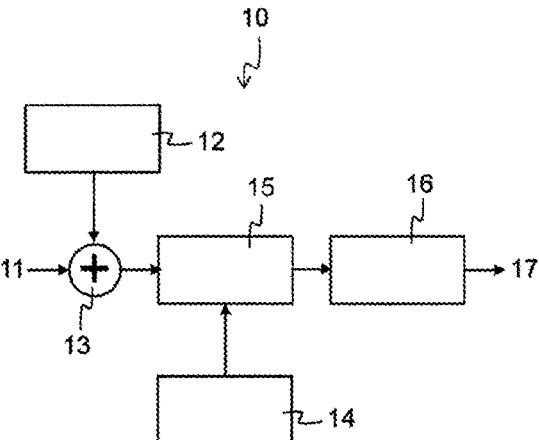
FIG. 1 is a block diagram illustrating a configuration of an analog-digital converter according to a first embodiment of the present invention.

An analog-digital converter according to a first embodiment of the present invention will be described with reference to FIG. 1. The analog-digital converter according to the present embodiment adopts time-division multiplexing.
Configuration of Analog-Digital Converter An analog-digital converter 10 according to the present embodiment employs time-division multiplexing, and includes, as shown in FIG. 1, a first reference light generation unit 12, a computing unit 13, a second reference light generation unit 14, a detection unit 15, and a conversion unit 16.

An optical analog signal (signal light) 11 is input to the analog-digital converter 10.

The first reference light generation unit 12 is a time-varying reference light generation unit, which generates first reference light by varying it with time and outputs the light to the computing unit 13.

The computing unit 13 adds the first reference light to the input signal light to perform affine transformation (parallel shift) of the signal light.

In the optical affine transformation, the magnitude of the signal light can be detected by comparison with a plurality of reference light beams. Specifically, the magnitude of the signal light can be detected by adding a plurality of reference light beams having different amplitudes (magnitudes) to the signal light and then determining the magnitude of the signal light with respect to a predetermined threshold.

The second reference light generation unit 14 is a time-varying reference light generation unit, which generates second reference light by varying it with time and outputs the light to the detection unit 15.

The detection unit 15 performs homodyne detection for the signal light subject to affine transformation on an arbitrary detection axis using the second reference light, and acquires an electrical analog signal.

By using an arbitrary detection axis, a phase of the signal light can be mainly detected. More specifically, the phase of the signal light can be detected by discriminating the signal light by using a plurality of reference light beams having different phases (described later).

The conversion unit 16 converts the electrical analog signal into an electrical digital signal 17 by performing thresholding with a low bit resolution (1 to 2 bits). This low-bit thresholding can reduce power consumption.

According to the analog-digital converter 10 of the present embodiment, affine transformation (detection of signal light intensity) and homodyne detection (detection of signal light phase) can be performed by optical processing in the O-E ADC. Consequently, it is possible to reduce power consumption.

Second Embodiment

An analog-digital converter according to a second embodiment of the present invention will be described with reference to FIG. 2. The analog-digital converter according to the present embodiment adopts space-division multiplexing.

Configuration of Analog-Digital Converter

Figure 2:
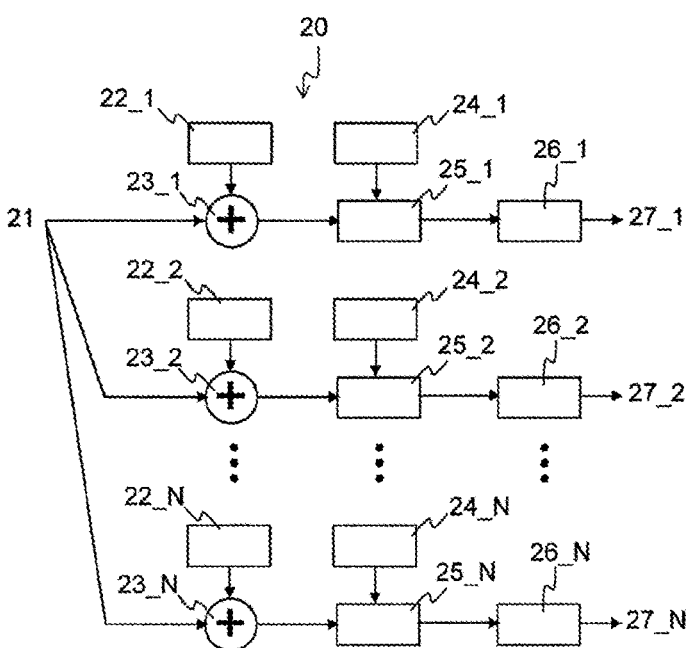
FIG. 2 is a block diagram illustrating a configuration of an analog-digital conversion system according to a second embodiment of the present invention.

An analog-digital converter 20 according to the present embodiment employs space-division multiplexing, and, as shown in FIG. 2, includes a plurality (N) of first reference light generation units 22_1 to 22_N, a plurality (N) of computing units 23_1 to 23_N, a plurality (N) of second reference light generation units 24_1 to 24_N, a plurality (N) of detection units 25_1 to 25_N, and a plurality (N) of conversion units 26_1 to 26_N.

An optical analog signal (signal light) 21 is input to the analog-digital converter 20.

The first reference light generation units 22_1 to 22_N respectively generate first reference light and output the light to the computing unit.

The computing units 23_1 to 23_N respectively add the first reference light to the input signal light to perform affine transformation (parallel shift) of the signal light. As in the first embodiment, the magnitude of the signal light can be detected by comparing the signal light with a plurality of reference light beams in optical affine transformation.

The second reference light generation units 24_1 to 24_N respectively generate second reference light and output the light to the detection unit 25_1 to 25_N.

The detection units 25_1 to 25_N respectively perform homodyne detection for the signal light subject to affine transformation on an arbitrary detection axis using the second reference light, and acquires an electrical analog signal. As in the first embodiment, a phase of the signal light can be mainly detected using an arbitrary detection axis.

The conversion units 26_1 to 26_N convert the electrical analog signals into electrical digital signals 27_1 to 27_N with a low bit resolution (1 to 2 bits), respectively. This low-bit analog-to-digital (AD) conversion can reduce power consumption.

According to the analog-digital converter 20 of the present embodiment, affine transformation (detection of signal light intensity) and homodyne detection (detection of signal light phase) can be performed by optical processing in the O-E ADC. Consequently, it is possible to reduce power consumption.

Analog-Digital Conversion Method

Figure 3:
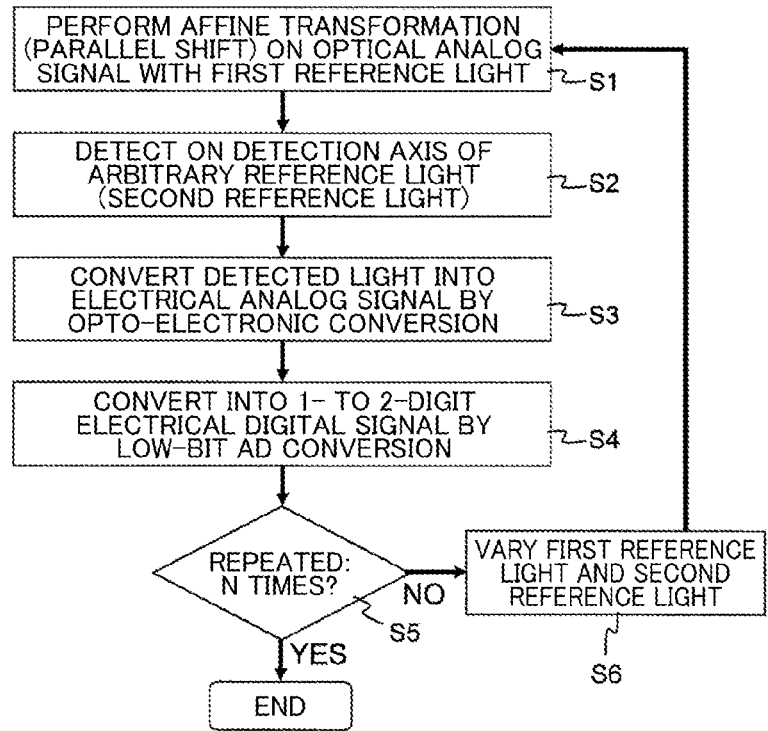
FIG. 3 is a flowchart illustrating an analog-digital conversion method according to the first embodiment of the present invention.
Figure 4A:
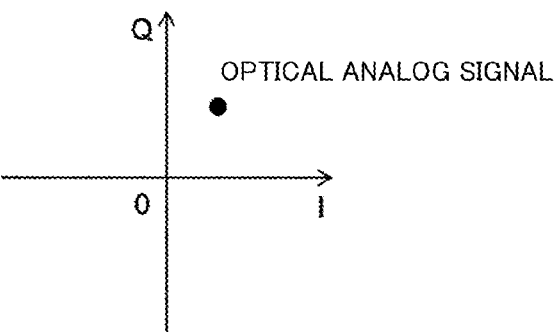
FIG. 4A is a diagram illustrating the analog-digital conversion method according to the first and second embodiments of the present invention.

An analog-digital conversion method according to the first and second embodiments will be described with reference to FIGS. 3 to 4D. FIG. 3 shows a flowchart of the analog-digital conversion method according to the present embodiment. FIGS. 4A to 4D respectively show IQ plan views illustrating the analog-digital conversion method according to the present embodiment.

An optical analog signal (signal light) is input. FIG. 4A shows an initial state of the optical analog signal to be converted.

Figure 4B:
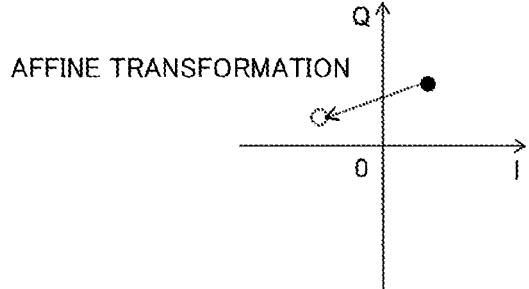
FIG. 4B is a diagram illustrating the analog-digital conversion method according to the first and second embodiments of the present invention.

As shown in FIG. 4B, the first reference light is added to the input signal light to perform affine transformation (parallel shift) of the signal light (step S1).

Figure 4C:
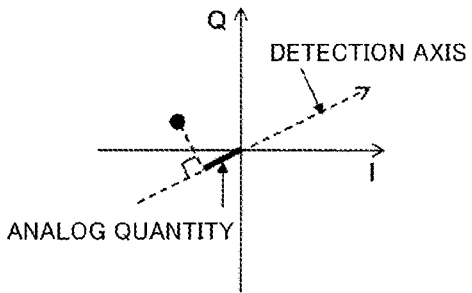
FIG. 4C is a diagram illustrating the analog-digital conversion method according to the first and second embodiments of the present invention.
Figure 4D:
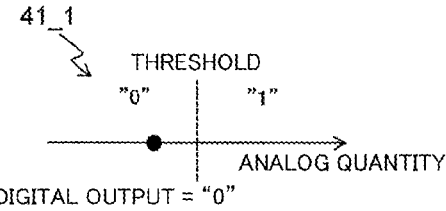
FIG. 4D is a diagram illustrating the analog-digital conversion method according to the first and second embodiments of the present invention.
Figure 4D:
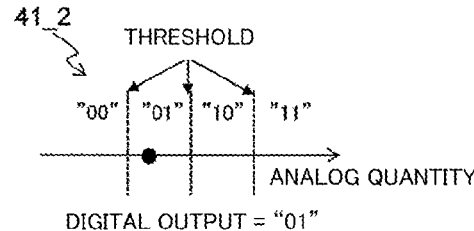

As shown in FIG. 4C, the light subject to affine transformation is detected by the detection axis of arbitrary reference light (second reference light) (step S2). Subsequently, the detected light is converted into an electrical analog signal by opto-electronic conversion (step S3). Indeed, the magnitude of the analog signal changes depending on the magnitude of the reference light, but it is assumed herein that an orthographic projection (a bold line in the figure) on the reference axis is detected as an analog quantity.

As shown in FIG. 4D, the value (analog quantity) of the electrical analog signal is converted into a 1- or 2-digit electrical digital signal by low-bit AD conversion of 1 to 2 bits (step S4). In the figure, 41_1 and 41_2 denote 1-bit AD conversion and 2-bit AD conversion, respectively.

In a case where time-division multiplexing is adopted, the first reference light and the second reference light are time-varied and the above steps are repeated a preset number of times (N times) to acquire a digital signal of a plurality of digits (steps S5 and S6).

In a case where space-division multiplexing is adopted, as shown in FIG. 2, since the plurality of the first and second reference light beams are used, a digital signal of a plurality of digits can be acquired by repeating the above steps once. In this case, steps S5 and S6 are not required.

In the analog-digital conversion method according to the present embodiment, affine transformation and homodyne detection are processing using only linear optical elements in an optical circuit, and therefore, wavelength-division multiplexing can also be used. Thus, by combining and using time-division multiplexing, space-division multiplexing and wavelength-division multiplexing, a digital signal of a higher bit number can be acquired at a higher speed.

A specific example of the analog-digital conversion method according to the present embodiment will be described below.

Figure 5A:
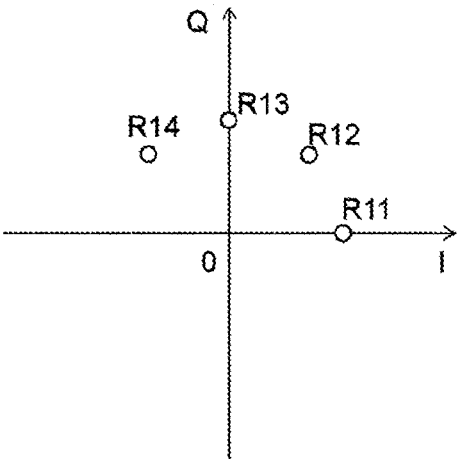
FIG. 5A is a diagram illustrating one example of the analog-digital conversion method according to the first and second embodiments of the present invention.
Figure 5B:
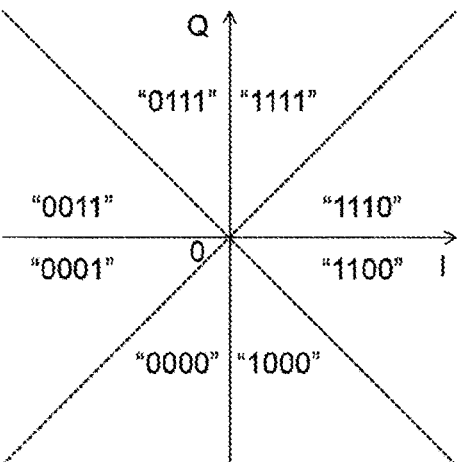
FIG. 5B is a diagram illustrating one example of the analog-digital conversion method according to the first and second embodiments of the present invention.

FIGS. 5A and 5B show a mode of analog-digital conversion in a case of using phases of a plurality of second reference light beams. FIG. 5A shows IQ component of the second reference light. Absolute phases of second reference light beams R11, R12, R13 and R14 are 0, π/4, π/2 and 3π/4, and the amplitudes are the same.

After performing four types of homodyne detection using these four second reference beams R11 to R14, the results (numbers) of 1-bit analog-digital conversion for each of the second reference beams are arranged (deployed) in order. Consequently, as shown in FIG. 5B, a 4-digit electrical digital signal (within brackets in the figure) is obtained with a 1-bit thresholder. The highest order is the second reference light R14, followed by R13, R12, and R11. Thus, when combining the phases of four reference light beams and the 1-bit thresholder, there are eight ways of quantization.

As described above, in the analog-digital conversion method according to the present embodiment, a digital signal is determined by the phase of the optical analog input signal.

Figure 6A:
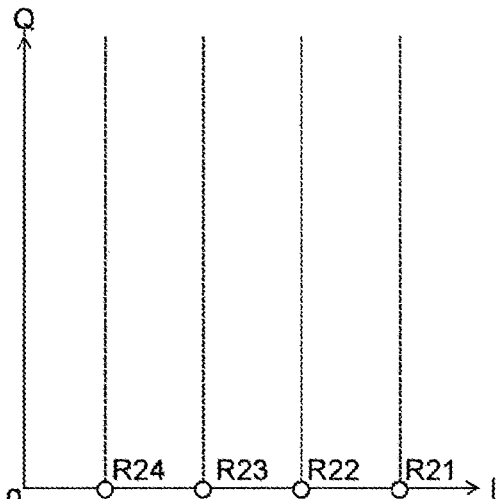
FIG. 6A is a diagram illustrating one example of the analog-digital conversion method according to the first and second embodiments of the present invention.
Figure 6B:
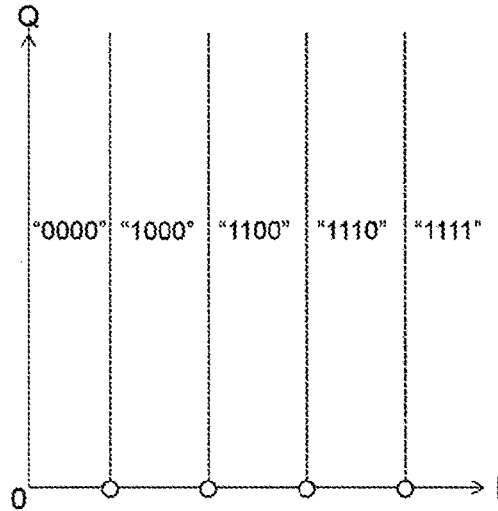
FIG. 6B is a diagram illustrating one example of the analog-digital conversion method according to the first and second embodiments of the present invention.

FIGS. 6A and 6B show a mode of analog-digital conversion in a case of using amplitudes of a plurality of first reference light beams. FIG. 6A shows IQ component of the first reference light. Absolute phases of first reference light beams R21, R22, R23 and R24 are 0, respectively, and four types of amplitude are used.

After performing four types of affine transformation using these four first reference beams R21 to R24, the results (numbers) of 1-bit analog-digital conversion for each of the first reference beams are arranged (deployed) in order. Consequently, as shown in FIG. 6B, a 4-digit electrical digital signal (within brackets in the figure) is obtained with a 1-bit thresholder. The highest order is the first reference light R24, followed by R23, R22, and R21. Thus, when combining the amplitudes of four reference light beams and the 1-bit thresholder, there are five ways of quantization.

As described above, in the analog-digital conversion method according to the present embodiment, a digital signal is determined by the "amplitude" of the optical analog input signal.

Figure 7A:
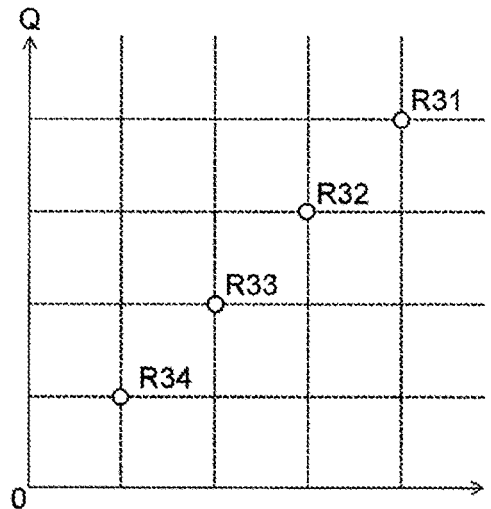
FIG. 7A is a diagram illustrating one example of the analog-digital conversion method according to the first and second embodiments of the present invention.

FIGS. 7A and 7B show a mode of analog-digital conversion in a case of using the first and second reference light beams. FIG. 7A shows IQ components of the second reference light beams R31, R32, R33 and R34. Absolute phases are fixed to π/4, and a plurality of amplitudes are used.

After four types of affine transformation using the first reference light, two types of homodyne detection (IQ detection) are performed using four second reference light beams R31 to R34. Specifically, two types of homodyne detection (IQ detection) with a phase difference of π/2 are performed. The I-channel and Q-channel results (numbers) of 1-bit analog-digital conversion for each second reference light beam are arranged (deployed) in order.

Consequently, as shown in FIG. 7B, 4-digit electrical digital signals (within brackets in the figure, the I-channel results are shown in the upper row and the Q-channel results are shown in the lower row) are obtained by two sets with a 1-bit thresholder. The highest order is the second reference light R34, followed by R33, R32, and R31. Thus, when combining the "I component" and "Q component" in the four reference light beams and the 1-bit thresholder, there are 25 ways of quantization.

As described above, in the analog-digital conversion method according to the present embodiment, a digital signal is determined by the "I component" and the "Q component" of the optical analog input signal.

Effects

Advantageous effects of the analog-digital conversion method and analog-digital converter according to the first and second embodiments will be described with reference to FIGS. 8 to 10B. A case of using the phase of the second reference light (hereinafter referred to as "Type A") and a case of using the "I component" and "Q component" of the second reference light (hereinafter referred to as "Type B") are described as examples.

A relationship between the number x of homodyne detections and the maximum quantization number in the analog-digital conversion method and analog-digital converter according to the present embodiment will be described.

Figure 8:
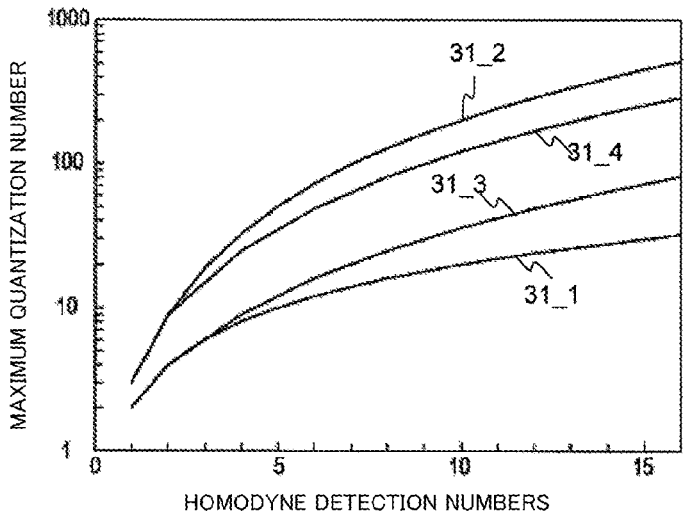
FIG. 8 is a diagram illustrating effects of the analog-digital conversion method and the analog-digital converter according to an embodiment of the present invention.

FIG. 8 shows a relationship between the number x of homodyne detections and the maximum quantization number in analog-digital conversion, in a case of Type A with 1 bit (31_1 in the figure) and 1.5 bits (31_2 in the figure) and Type B with 1 bit (31_3 in the figure) and 1.5 bits (31_4 in the figure).

The relationship between the number x of homodyne detections and the maximum quantization number is derived by calculating a specific example of the numerical analysis value of the maximum quantization number obtained for the detection numbers 2, 4, 6, 8, and 16, and inferring the general formula from the sequence acquired.

The maximum quantization number does not depend on the analog-digital conversion method, and monotonously increases with respect to the number x of homodyne detections, but the dependency on the number x of homodyne detections differs as follows.

For Type A (1 bit), it depends on 2x (31_1). For Type A (1.5 bits), it depends on $2x^2+1$ (31_2).

For Type B (1 bit), it depends on $(x/2+1)^2$ (31_3). For Type B (1.5 bits), it depends on $(x+1)^2$ (31_4).

As shown in FIG. 8, the maximum quantization number is the smallest for Type A (1 bit), and followed by Type B (1 bit), Type B (1.5 bits), and Type A (1.5 bits).

In this way, Type A (1.5 bits) can increase the quantization number most efficiently. However, in this case, the division is uneven on the IQ plane.

For example, in a case of 1.0 bit, as shown in FIG. 4(a), a threshold boundary line passes through the origin and divides the IQ plane evenly into eight, so that the quantized signal is uniformly distributed. On the other hand, in a case of 1.5 bits, the threshold boundary does not pass through the origin, and the intersection point shifts from the origin to not evenly divide the IQ plane into eight, resulting in non-uniform distribution of the quantized signal.

In analog-digital conversion, non-uniform distribution of the quantized signal results in non-linear conversion and is difficult to control. On the other hand, if the quantized signal is uniformly distributed, it is desirable because it results in a linear transformation.

For Type B, as shown in FIG. 7B, the reference light can be set so as to be uniformly divided in a grid pattern on the IQ plane regardless of resolution of the analog-digital conversion used in low-bit quantization, thus it is desirable for use in analog-digital conversion.

Power consumption (energy consumption) in the analog-digital conversion method and analog-digital converter according to the present embodiment will be described with reference to FIGS. 9A to 10B. The figures show cases where a 1.0-bit thresholder (32_1 in the figure), a 1.5-bit thresholder (32_2 in the figure), and a 2.0-bit thresholder (32_3 in the figure) are used for Type A in O-E ADC.

The energy consumption is calculated as the sum of a value obtained by multiplying the number of photodiodes required for each configuration by energy consumption per PD, which will be described later, and a value obtained by multiplying energy consumption of the thresholder by the number of thresholders required for each configuration.

It is assumed that the reference energy consumption of the ADC is 50 fJ/conversion, 50 fJ/conversion for the 1-bit thresholder, 100 fJ/conversion for the 1.5-bit thresholder, and $2^n \times 50$ fJ/conversion for n-bit thresholder. It is also assumed that the energy consumption per photodiode (PD) is 5 fJ/conversion (K. Nozaki et al., "Photonic-crystal nano-photodetector with ultrasmall capacitance for on-chip light-to-voltage conversion without an amplifier," Optica 3, 483-492 (2016)).

Figure 9A:
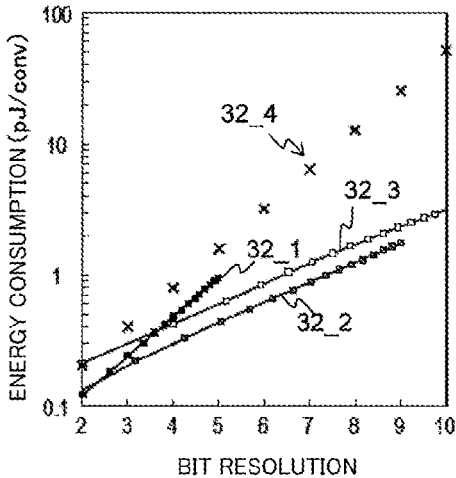
FIG. 9A is a diagram illustrating effects of the analog-digital conversion method and the analog-digital converter according to an embodiment of the present invention.

FIG. 9A shows bit resolution dependency of energy consumption in a case of using Type A in the O-E ADC and in a case of using an ADC that performs all processing electrically (hereinafter referred to as "electrical ADC"; denoted by 32_4 in the figure).

Since space-division multiplexing is assumed here, the number of PDs increases as the bit resolution increases. Further, the bit resolution of the O-E ADC is obtained as a base-2 logarithm ($\log_2 y$) with respect to the quantization number y shown in FIG. 5.

Figure 9B:
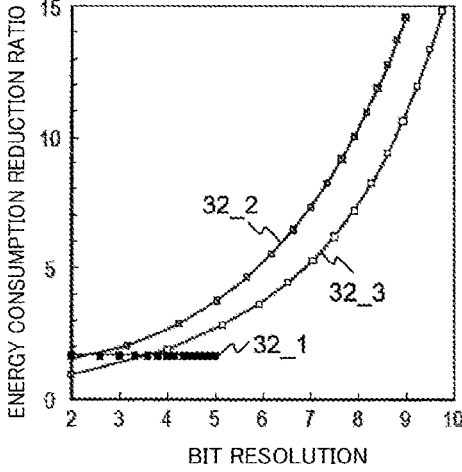
FIG. 9B is a diagram illustrating effects of the analog-digital conversion method and the analog-digital converter according to an embodiment of the present invention.

FIG. 9B shows a degree of reduction (reduction ratio) in energy consumption in each of the O-E ADCs shown in FIG. 9A compared to the electrical ADC.

For Type A, in a case of using the 1.5- or 2.0-bit thresholder, the energy consumption reduction ratio increases as the bit resolution increases. Furthermore, in a case of using the 1.5-bit threshold processor, the energy consumption reduction ratio is large, equivalent to 8-bit and about 10 times. The energy consumption reduction ratio is a ratio of each energy consumption to the energy consumption by the electrical ADC.

Thus, in a case of using the 1.5-bit thresholder, there is a significant effect in reducing energy consumption. In addition, with the increase in bit resolution, energy consumption is significantly reduced.

Figure 10A:
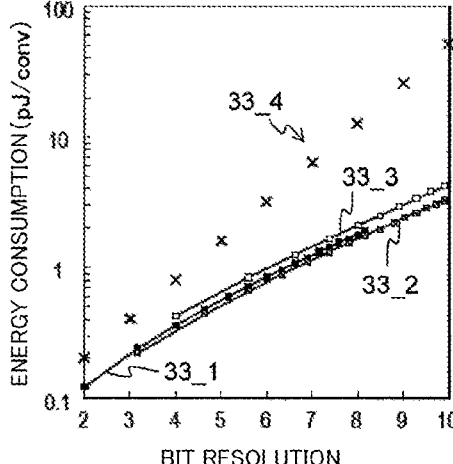
FIG. 10A is a diagram illustrating effects of the analog-digital conversion method and the analog-digital converter according to an embodiment of the present invention.

Similarly, FIG. 10A shows the bit resolution dependency of energy consumption in a case of using Type B in O-E ADC and in a case of using an electrical ADC. It shows cases where, for Type A, a 1.0-bit thresholder (33_1 in the figure), a 1.5-bit thresholder (33_2 in the figure), and a 2.0-bit thresholder (33_3 in the figure) are used. In addition, a case of using an electrical ADC (33_4 in the figure) is also shown.

Figure 10B:
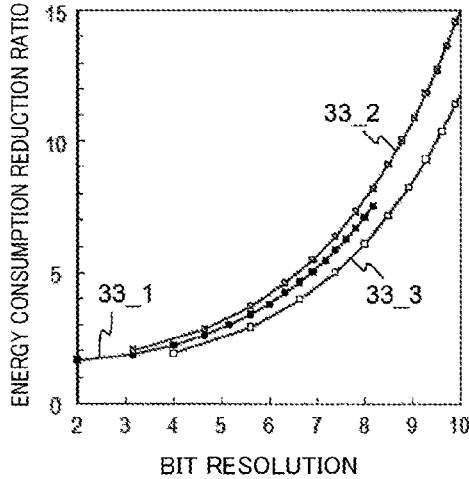
FIG. 10B is a diagram illustrating effects of the analog-digital conversion method and the analog-digital converter according to an embodiment of the present invention.

FIG. 10B shows a degree of reduction (reduction ratio) in energy consumption in each of the O-E ADCs shown in FIG. 10A compared to the electrical ADC.

For Type B, 1.0, 1.5-bit or 2.0-bit thresholders can reduce energy consumption to the same degree, and the energy consumption can be reduced as the bit resolution increases. Among these, the use of 1.5-bit thresholder is especially effective in reducing energy consumption.

Thus, in the analog-digital conversion method and the analog-digital converter according to the first and second embodiments, the optical circuit performs a plurality of processes in the O-E ADC, and a plurality of digital signals are acquired via a low-bit electrical ADC for the plurality of analog quantities derived therefrom.

According to the analog-digital conversion methods and analog-digital converters of the first and second embodiments, power consumption can be significantly reduced compared to when a high-bit electrical ADC is used.

First Example

An analog-digital converter according to a first example of the present invention will be described with reference to FIG. 11.

Configuration of Analog-Digital Converter

An analog-digital converter 100 according to this example is one example of the configuration of the first embodiment.

Figure 11:
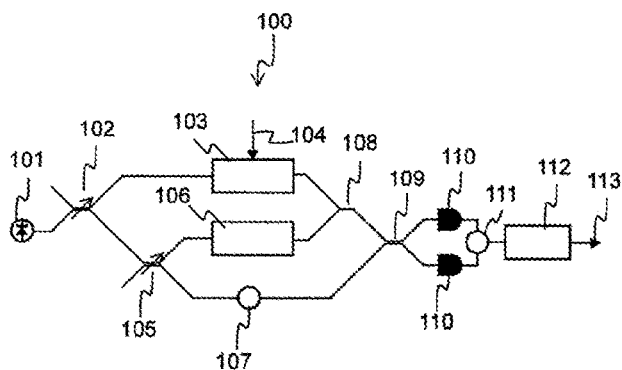
FIG. 11 is a diagram illustrating a configuration of an analog-digital converter according to a first example of the present invention.

As shown in FIG. 11, the analog-digital converter 100 includes an optical IQ modulator 106, a phase modulator 107, a Y multiplexer 108, a coupler 109, a photodetector 11*o*, a differential amplifier 11, and a thresholder 112.

As a configuration for generating signal light to be input to the analog-digital converter 100, a continuous wave laser diode (CW LD) 101 is connected to a demultiplexer 102, and one output end of the demultiplexer 102 is connected to an optical interferometer 103.

The other output end of the demultiplexer 102 is connected to the other demultiplexer 105.

One output end of the other demultiplexer 105 is connected to the optical IQ modulator 106 in the analog-digital converter 100. Also, one output end of the other demultiplexer 105 is connected to the phase modulator 107.

The demultiplexers 102 and 105 are preferably variable splitters so that a distribution ratio between the signal light and the reference light can be optimally set.

An output end of the optical interferometer 103 and an output end of optical IQ modulator 106 are connected to the Y multiplexer 108, and an output end of Y multiplexer 108 and an output end of phase modulator 107 are connected to the coupler 109.

Each of two outputs from the coupler 109 is connected to the photodetector 11*o* and an output of each photodetector 11*o* is connected to the differential amplifier 111.

An output of differential amplifier 111 is connected to the thresholder 112.

Operations of Analog-Digital Converter

In the optical interferometer 103, light inputted from a CW light source 101 via the demultiplexer 102 is modulated by an electrical input signal 104 and outputted as signal light.

The optical IQ modulator 106 time-divisionally outputs the light branched from the CW light source 101 by the demultiplexer 102 as reference light for affine transformation (first reference light).

The Y multiplexer 108 multiplexes the signal light that is the output from the optical interferometer 103, with the first reference light that is the output of the optical IQ modulator 106, and performs affine transformation.

The phase modulator 107 time-divisionally outputs the light branched from the CW light source 101 by the demultiplexers 102 and 105 as reference light for homodyne detection (second reference light).

The coupler 109 causes the signal light subject to affine transformation by the Y multiplexer 108 to interfere with the second reference light and outputs two interference light beams.

Each photodetector 110 converts the output light of the coupler 109 into an electrical signal and outputs the electrical signal to the differential amplifier 11.

The differential amplifier 11 acquires a differential signal from each electrical signal. Thus, the signal obtained by homodyne detection is output to the thresholder 112.

The thresholder 112 quantizes the differential signal to obtain an electrical digital signal 113.

In this example, a Y-branch or a specific fixed-ratio coupler may be used as the demultiplexer. When emphasizing reconfigurability, it is desirable to use a variable splitter.

In this example, a 3-dB coupler such as a directional coupler or a multimode interference waveguide can be used as the coupler.

In this example, not only the differential amplifier, but also a differential computing unit may be used. A transimpedance amplifier may be also used instead of the thresholder.

According to the analog-digital converter 100 of this example, operations are available for Type A and Type B described above. In a case of operating for Type B, the phase modulator 107 should be time-varied at a phase change of $\pi/2$.

According to the analog-digital converter 100 of this example, affine transformation and homodyne detection can be performed by optical processing in the O-E ADC.

Thus, the analog-digital converter 100 of this example can reduce power consumption.

Second Example

An analog-digital converter according to a second example of the present invention will be described with reference to FIGS. 12 and 13.

Configuration of Analog-Digital Converter

Figure 12:
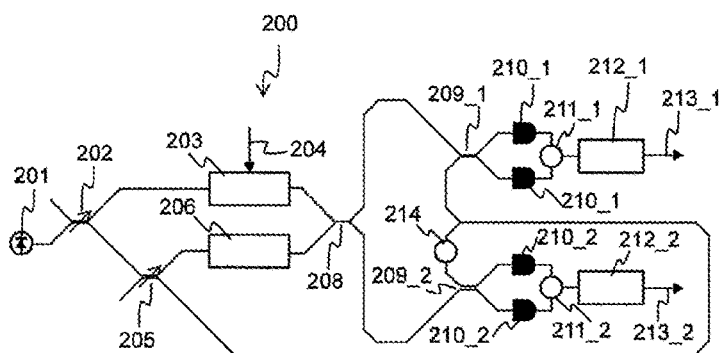
FIG. 12 is a diagram illustrating a configuration of an analog-digital converter according to a second example of the present invention.

As shown in FIG. 12, an analog-digital converter 200 includes an optical IQ modulator 206, a Y multiplexer 208, couplers 209_1 and 209_2, photodetectors 210_1 and 210_2, differential amplifiers 211_1 and 211_2, thresholders 212_1 and 2122, and a q/2 phase shifter 214.

As a configuration for generating signal light to be input to the analog-digital converter 100, a configuration including a continuous wave laser diode (CW LD) 201 and an optical interferometer 203, and a configuration where a light source is connected to the optical IQ modulator 206 in the analog-digital converter 100 via the demultiplexers 202 and 205 are the same as in the first example.

The analog-digital converter 200 includes the Y multiplexer 208 after the optical IQ modulator 206, and two configurations for performing homodyne detection as in the first example (hereinafter referred to as "homodyne detection circuits") and the thresholders 212_1 and 212_2 are connected in parallel.

One homodyne detection circuit is configured by the coupler 209_1, the photodetector 210_1, and the differential amplifier 211_1. The other homodyne detection circuit is configured by the coupler 209_2, the photodetector 2102, and the differential amplifier 211_2.

Out of the two homodyne detection circuits, the π/2 phase shifter 214 is arranged in front of an input terminal of the second reference light in the other homodyne detection circuit. Accordingly, the second reference light is input to the couplers 209_1 and 209_2 of respective homodyne detection circuits with a π/2 phase difference.

In this configuration, one homodyne detection circuit outputs an I component 213_1, and the other homodyne detection circuit outputs a Q component 213_2.

According to the analog-digital converter of this example, operations are available for Type B described above.

According to the analog-digital converter 200 of this example, affine transformation and homodyne detection can be performed by optical processing in the O-E ADC.

Thus, the analog-digital converter 200 of this example can reduce power consumption.

Modified Example

Figure 13:
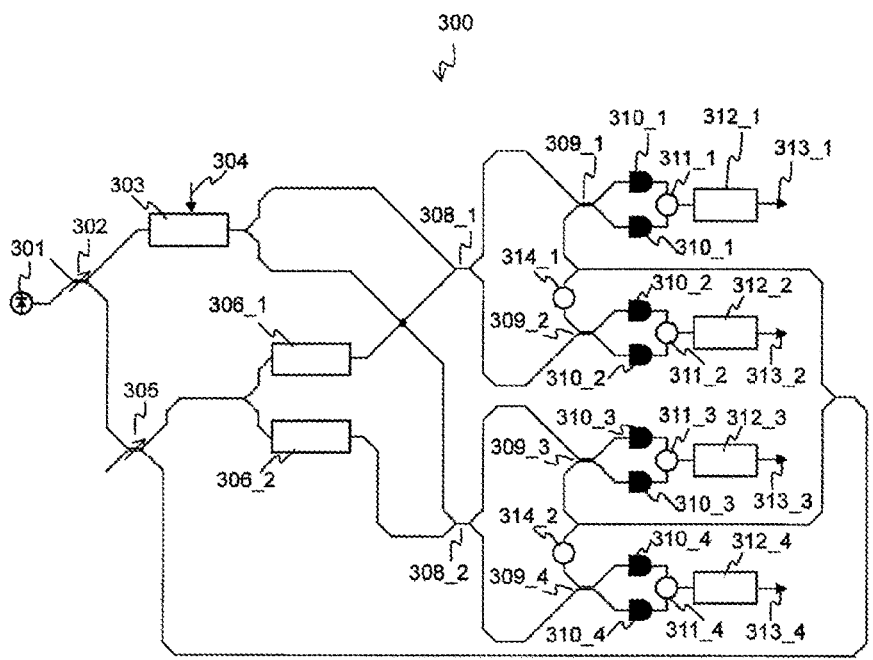
FIG. 13 is a diagram illustrating a configuration of an analog-digital converter according to a modified example of the first example of the present invention.

As a modified example of the first example, as shown in FIG. 13, two optical IQ modulators 306_1 and 306_2 may be used, Y multiplexers 308_1 and 308_2 may be provided after the optical IQ modulators 306_1 and 306_2, and four homodyne detection circuits and thresholders 312_1 to 312_4 may be connected in parallel. With this configuration, the number of space divisions can be doubled.

Figure 14:
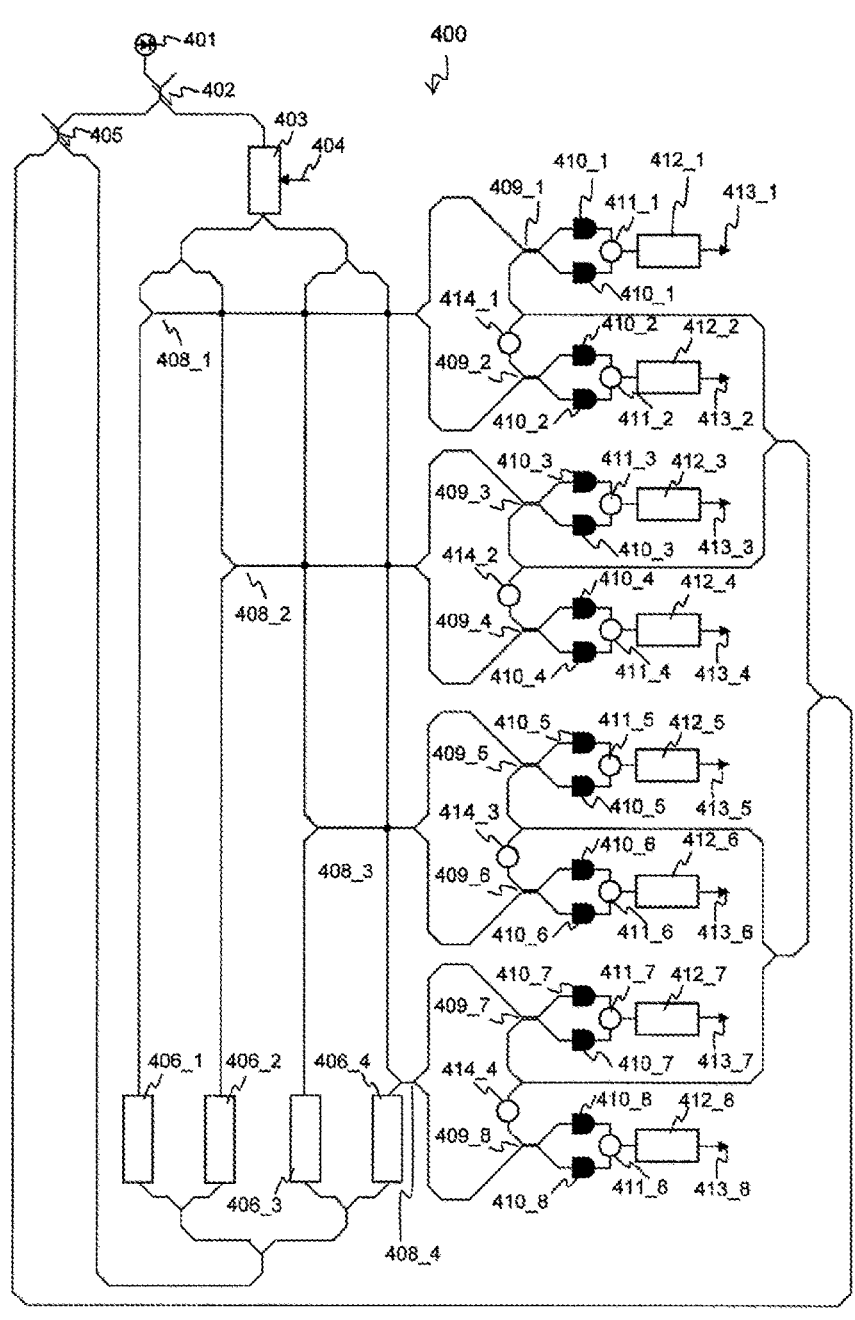
FIG. 14 is a diagram illustrating a configuration of an analog-digital converter according to a modified example of the first example of the present invention.

Further, as shown in FIG. 14, four optical IQ modulators 406_1 to 406_4 may be used, Y multiplexers 408_1 to 408_4 may be provided after the optical IQ modulators 406_1 to 406_4, and eight homodyne detection circuits and thresholders 412_1 to 412_8 may be connected in parallel. With this configuration, the number of space divisions can be increased by four times.

Although the examples and the modified example of the present invention show examples in which the reference light for affine transformation is generated by the IQ modulator, the present invention is not limited thereto. In a case where time division is not used, fixed attenuators and phase shifters can be used.

In addition, in a case where the increase in the number of space divisions is restricted due to, for example, circuit area, it can be dealt with by appropriately combining time division and wavelength division.

Third Embodiment

An analog-digital converter and an analog-digital conversion method according to a third embodiment of the present invention will be described with reference to FIGS. 15 to 17.

Figure 15:
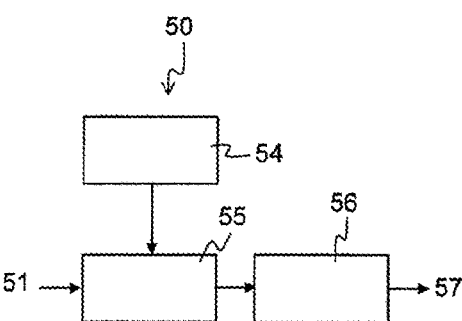
FIG. 15 is a block diagram illustrating a configuration of an analog-digital converter according to a third embodiment of the present invention.

An analog-digital converter 50 according to the present embodiment includes, in a case of employing time-division multiplexing, as shown in FIG. 15, a second reference light generation unit 54, a detection unit 55, and a conversion unit 56.

An optical analog signal (signal light) 51 is input to the analog-digital converter 50.

The second reference light generation unit 54 is a time-varying reference light generation unit, which generates second reference light by varying it with time and outputs the light to the detection unit 55.

The detection unit 55 performs homodyne detection on an arbitrary detection axis using the second reference light, and acquires an electrical analog signal.

The conversion unit 56 converts the electrical analog signal into an electrical digital signal 57 with a low bit resolution (1 to 2 bits). This low-bit analog-to-digital (AD) conversion can reduce power consumption.

The analog-digital conversion method according to the present embodiment does not require step S1 in the analog-digital conversion method according to the first embodiment.

According to the analog-digital converter of the present embodiment, the operations for Type A can be available as in the first embodiment.

According to the analog-digital converter 50 of the present embodiment, homodyne detection can be performed by optical processing in the O-E ADC. Consequently, it is possible to reduce power consumption.

Thus, the analog-digital converter 50 according to the present embodiment can reduce power consumption.

Third Example

An analog-digital converter and an analog-digital conversion method according to a third example of the present invention will be described with reference to FIG. 16. An analog-digital converter 500 according to this example is one example of the configuration of the third embodiment, as shown in FIG. 16.

Configuration of Analog-Digital Converter

Figure 16:
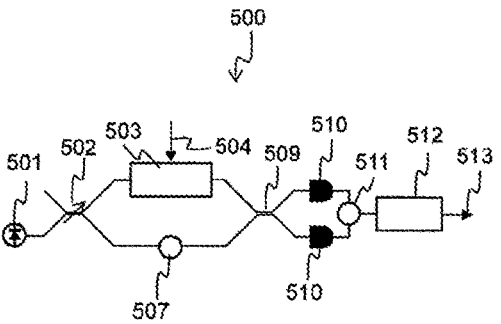
FIG. 16 is a diagram illustrating a configuration of an analog-digital converter according to a third example of the present invention.

As shown in FIG. 16, the analog-digital converter 500 includes a phase modulator 507, a coupler 509, a photodetector 510, a differential amplifier 511, and a thresholder 512.

As a configuration for generating signal light to be input to the analog-digital converter 500, a continuous wave laser diode (CW LD) 501 is connected to a demultiplexer 502, and one output end of the demultiplexer 502 is connected to an optical interferometer 503.

The other output end of the demultiplexer 503 is connected to the phase modulator 507 in the analog-digital converter 500.

An output end of optical interferometer 503 and an output end of phase modulator 507 are connected to coupler 509.

Each of two outputs from the coupler 509 is connected to the photodetector 510 and an output of each photodetector 510 is connected to the differential amplifier 511.

An output of differential amplifier 511 is connected to the thresholder 512.

Operations of Analog-Digital Converter

In the optical interferometer 503, light inputted from a CW light source 501 via the demultiplexer 502 is modulated by an electrical input signal and outputted as signal light.

The phase modulator 507 time-divisionally outputs the light branched from the CW light source 501 by the demultiplexer 502 as reference light for homodyne detection (second reference light).

The coupler 509 causes the signal light from the optical interferometer 503 to interfere with the second reference light and outputs two interference light beams.

Each photodetector 510 converts the output light of the coupler 509 into an electrical signal and outputs the electrical signal to the differential amplifier 511.

The differential amplifier 511 acquires a differential signal from each electrical signal. Thus, the signal obtained by homodyne detection is output to the thresholder 512.

The thresholder 512 quantizes the differential signal to obtain an electrical digital signal 513.

According to the analog-digital converter 500 of this example, operations are available for Type A described above.

According to the analog-digital converter 500 of this example, homodyne detection can be performed by optical processing in the O-E ADC.

Thus, the analog-digital converter 500 of this example can reduce power consumption.

Figure 17:
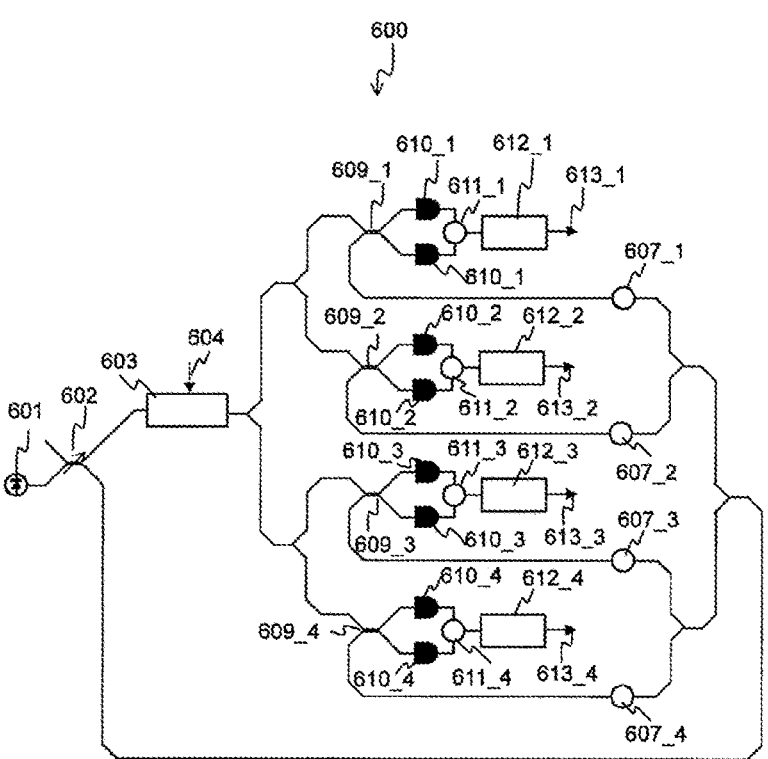
FIG. 17 is a diagram illustrating one example of the configuration of the analog-digital converter according to the third example of the present invention.

Further, as shown in FIG. 17, a plurality of homodyne detection circuits may be connected in parallel after phase modulators 607_1 to 607_4 adopting space division multiplexing. The number of space divisions can be accordingly increased. The analog-digital conversion method in this case does not require steps S2, S5 and S6 in the analog-digital conversion method according to the first embodiment.

Fourth Embodiment

An analog-digital converter and an analog-digital conversion method according to a fourth embodiment of the present invention will be described with reference to FIGS. 18 and 19.

Configuration of Analog-Digital Converter

Figure 18:
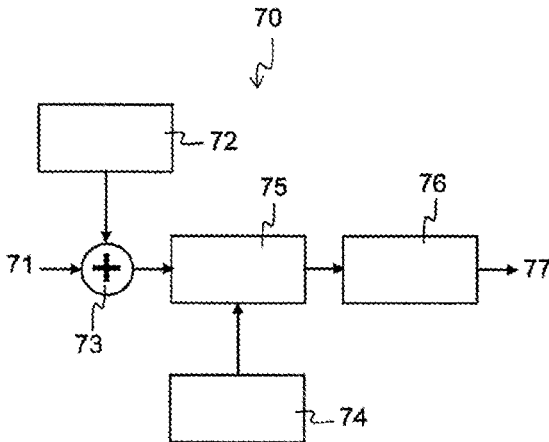
FIG. 18 is a block diagram illustrating a configuration of an analog-digital converter according to a fourth embodiment of the present invention.

An analog-digital converter 70 according to the present embodiment includes, in a case of employing time-division multiplexing, as shown in FIG. 18, a first reference light generation unit 72, a computing unit 73, a second reference light generation unit 74, a detection unit 75, and a conversion unit 76.

An optical analog signal (signal light) 71 is input to the analog-digital converter 70.

The first reference light generation unit 72 is a time-varying reference light generation unit, which generates first reference light by varying it with time and outputs the light to the computing unit 73.

The computing unit 73 adds the first reference light to the input signal light to perform affine transformation (parallel shift) of the signal light.

The second reference light generation unit 74 generates second reference light and output the light to the detection unit 75.

The detection unit 75 performs homodyne detection for the signal light subject to affine transformation on an arbitrary detection axis using the second reference light, and acquires an electrical analog signal.

The conversion unit 76 converts the electrical analog signal into an electrical digital signal 77 with a low bit resolution (1 to 2 bits). This low-bit analog-to-digital (AD) conversion can reduce power consumption.

The analog-digital conversion method according to the present embodiment is the same as the first embodiment.

According to the analog-digital converter 70 of the present embodiment, affine transformation and homodyne detection can be performed by optical processing in the O-E ADC. Consequently, it is possible to reduce power consumption.

Fourth Example

An analog-digital converter and an analog-digital conversion method according to a fourth example of the present invention will be described with reference to FIG. 19.

Figure 19:
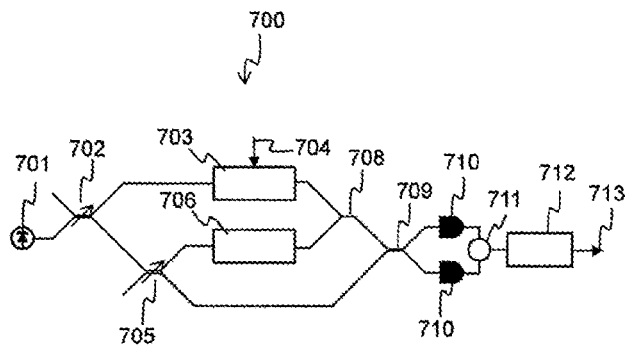
FIG. 19 is a diagram illustrating a configuration of an analog-digital converter according to a fourth example of the present invention.

An analog-digital converter 700 according to this example is one example of the configuration of the fourth embodiment, as shown in FIG. 19.

Configuration of Analog-Digital Converter

As shown in FIG. 19, the analog-digital converter 700 includes an optical IQ modulator 706, a Y multiplexer 708, a coupler 709, a photodetector 710, a differential amplifier 711, and a thresholder 712.

As a configuration for generating signal light to be input to the analog-digital converter 700, a continuous wave laser diode (CW LD) 701 is connected to a demultiplexer 702, and one output end of the demultiplexer 702 is connected to an optical interferometer 703.

The other output end of the demultiplexer 702 is connected to the other demultiplexer 705.

One output end of the other demultiplexer 705 is connected to the optical IQ modulator 706 in the analog-digital converter 700.

An output end of the optical interferometer 703 and an output end of optical IQ modulator 706 are connected to the Y multiplexer 708, and an output end of Y multiplexer 708 and an output end of the other demultiplexer 705 are connected to the coupler 709.

Each of two outputs from the coupler 709 is connected to the photodetector 710 and an output of each photodetector 710 is connected to the differential amplifier 711.

An output of differential amplifier 711 is connected to the thresholder 712.

Operations of Analog-Digital Converter

In the optical interferometer 703, light inputted from a CW light source 701 via the demultiplexer 702 is modulated by an electrical input signal and outputted as signal light.

The optical IQ modulator 706 time-divisionally outputs the light branched from the CW light source 701 by the demultiplexers 702 and 705 as reference light for affine transformation (first reference light).

The Y multiplexer 708 multiplexes the signal light that is the output from the optical interferometer 703, with the first reference light that is the output of the optical IQ modulator 706, and performs affine transformation.

The coupler 709 causes the signal light subject to affine transformation by the Y multiplexer 708 to interfere with the second reference light from the other demultiplexer 705 and outputs two interference light beams.

Each photodetector 710 converts the output light of the coupler 709 into an electrical signal and outputs the electrical signal to the differential amplifier 711.

The differential amplifier 711 acquires a differential signal from each electrical signal. Thus, the signal obtained by homodyne detection is output to the thresholder 712.

The thresholder 712 quantizes the differential signal to obtain an electrical digital signal 713.

According to the analog-digital converter 700 of this example, the analog-digital conversion operations in a case of using the amplitudes of the plurality of first reference light beams in the first embodiment are available (FIGS. 6A and 6B). The optical IQ modulator 706 varies the amplitude of the first reference light.

According to the analog-digital converter 700 of this example, affine transformation and homodyne detection can be performed by optical processing in the O-E ADC.

Thus, the analog-digital converter 700 of this example can reduce power consumption.

In the analog-digital conversion method and the analog-digital converter according to the embodiments and examples of the present invention, a case is shown in which the output light of the CW light source is branched and used as the first reference light and the second reference light. However, output light from another light source may be used as the first reference light and the second reference light.

In the analog-digital conversion method and the analog-digital converter according to the embodiments and examples of the present invention, a case is shown in which the first reference light and the second reference light are varied. However, at least any one of the first reference light and the second reference light may be time-varied.

Although examples of the structures, dimensions and materials of each component shown in the configurations of the analog-digital converter and the conversion method have been shown in the embodiments of the present invention, the present invention is not limited thereto. Any modifications may be used as long as they exhibit the functions of the analog-digital conversion method and the analog-digital converter.

INDUSTRIAL APPLICABILITY

Embodiments can be applied to analog-digital converters used in optical computers and optical neural networks, particularly to opto-electronic analog-digital converters.

REFERENCE SIGNS LIST

10: Analog-digital converter
12: First reference light generation unit
13: Computing unit
14: Second reference light generation unit
15: Detection unit
16: Conversion unit

The invention claimed is:

1. An analog-digital conversion method, the method comprising:
performing first processing on an optical analog signal to obtain a processed optical analog signal, the first processing including affine transformation with first reference light or homodyne detection with a detection axis of second reference light;
converting the processed optical analog signal into an electrical analog signal by photoelectric conversion; and
performing thresholding on the electrical analog signal to convert the electrical analog signal into an electrical digital signal, wherein,
the first processing includes performing the homodyne detection by varying a phase of the second reference light, and
the first processing includes performing the affine transformation by varying an amplitude of the first reference light and the homodyne detection with two phases having a phase difference of $\pi/2$ therebetween.

2. The analog-digital conversion method according to claim 1 wherein:
the first processing includes performing the affine transformation by varying an amplitude of the first reference light.

3. The analog-digital conversion method according to claim 1 wherein
the second reference light is subject to time variation.

4. The analog-digital conversion method according to claim 1, wherein
the first processing includes performing the affine transformation, and
the first reference light is subject to time variation.

5. The analog-digital conversion method according to claim 1, wherein
the first processing includes performing the homodyne detection, and
the second reference light is subject to time variation.

6. The analog-digital conversion method according to claim 1, wherein,
the first processing includes performing the affine transformation by varying an amplitude of the first reference light.

7. The analog-digital conversion method according to claim 6, wherein
the first reference light is subject to time variation.

8. The analog-digital conversion method according to claim 6, wherein
the first processing includes performing the homodyne detection with two phases having a phase difference of $\pi/2$ therebetween.

9. The analog-digital conversion method according to claim 8, wherein
the first reference light or the second reference light is subject to time variation.

10. The analog-digital conversion method according to claim 1, wherein
the first reference light or the second reference light is subject to time variation.

11. An analog-digital converter, comprising:
a first reference light generation circuit configured to generate first reference light;
a computing circuit configured to perform first processing on an optical analog signal, wherein the first processing comprises affine transformation with the first reference light or homodyne detection with a detection axis of second reference light; and
a conversion circuit configured to perform thresholding on the optical analog signal to convert the optical analog signal into an electrical digital signal, wherein,
the first processing includes performing the homodyne detection by varying a phase of the second reference light, and
the first processing includes performing the affine transformation by varying an amplitude of the first reference light and the homodyne detection with two phases having a phase difference of $\pi/2$ therebetween.

12. The analog-digital converter according to claim 11, further comprising:
a first reference light generation circuit configured to generate first reference light; and
a computing circuit configured to perform affine transformation on the optical analog signal with the first reference light.

13. An analog-digital conversion method, the method comprising:
performing first processing on an optical analog signal to obtain a processed optical analog signal, the first processing including affine transformation with first reference light or homodyne detection with a detection axis of second reference light;
converting the processed optical analog signal into an electrical analog signal by photoelectric conversion; and
performing thresholding on the electrical analog signal to convert the electrical analog signal into an electrical digital signal,
wherein, the first processing includes performing the affine transformation by varying an amplitude of the first reference light, and the first processing includes performing the homodyne detection with two phases having a phase difference of $\pi/2$ therebetween.

14. An analog-digital converter, comprising:

a first reference light generation circuit configured to generate first reference light;

a computing circuit configured to perform first processing on an optical analog signal, wherein the first processing comprises affine transformation with the first reference light; and a conversion circuit configured to perform thresholding on the optical analog signal to convert the optical analog signal into an electrical digital signal, wherein, the first processing includes performing the affine transformation by varying an amplitude of the first reference light, and the first processing includes performing homodyne detection with two phases having a phase difference of $\pi/2$ therebetween.

* * * * *